(12) United States Patent
Dey et al.

(10) Patent No.: US 11,909,401 B2
(45) Date of Patent: Feb. 20, 2024

(54) INPUT DRIVEN SELF-CLOCKED DYNAMIC COMPARATOR

(71) Applicant: University of Washington, Seattle, WA (US)

(72) Inventors: Samrat Dey, Seattle, WA (US);
Thomas Lewellen, Seattle, WA (US);
Jacques Christophe Rudell, Seattle, WA (US)

(73) Assignee: University of Washington, Seattle, WA (US)

( * ) Notice: Subject to any disclaimer, the term of this patent is extended or adjusted under 35 U.S.C. 154(b) by 119 days.

(21) Appl. No.: 17/766,689

(22) PCT Filed: Oct. 9, 2020

(86) PCT No.: PCT/US2020/055058
§ 371 (c)(1),
(2) Date: Apr. 5, 2022

(87) PCT Pub. No.: WO2021/072251
PCT Pub. Date: Apr. 15, 2021

(65) Prior Publication Data
US 2023/0336168 A1 Oct. 19, 2023

Related U.S. Application Data

(60) Provisional application No. 62/914,400, filed on Oct. 11, 2019.

(51) Int. Cl.
*H03K 5/00* (2006.01)
*H03K 5/24* (2006.01)
*H03K 19/20* (2006.01)

(52) U.S. Cl.
CPC ............. *H03K 5/24* (2013.01); *H03K 5/2427* (2013.01); *H03K 19/20* (2013.01)

(58) Field of Classification Search
CPC ........... H03K 5/24; H03K 5/22; H03K 5/249; H03K 5/247; H03K 19/20
See application file for complete search history.

(56) References Cited

U.S. PATENT DOCUMENTS 4,418,332 A * 11/1983 Mefford ............... H03K 5/1252
340/146.2
7,701,256 B2 4/2010 Hurrell
(Continued)

FOREIGN PATENT DOCUMENTS

| CN | 104092390 A | 10/2014 |
| CN | 110138386 A | 8/2019 |

(Continued)

OTHER PUBLICATIONS

International Preliminary Report on Patentability dated Apr. 12, 2022, issued in corresponding Internation Application No. PCT/US2020/055058, filed Oct. 9, 2020, 6 pages.
(Continued)

*Primary Examiner* — Tuan T Lam
(74) *Attorney, Agent, or Firm* — CHRISTENSEN O'CONNOR JOHNSON KINDNESS PLLC

(57) ABSTRACT

An input driven self-clocked dynamic comparator, and associated systems and methods are described herein. In one embodiment, self-clocked dynamic comparator, includes a latch configured to receive an input voltage (VIN), a reference voltage (VREF) and a clocking (CLKsf) signal, and configured to output a first rail-to-rail output (OUT+) signal and a second rail-to-rail output (OUT−) signal. The self-clocked dynamic comparator also includes a pre-amplifier (PRE-AMP) configured to output an enable (TRI) signal based on a comparison between the VIN and an adjusted VREF. The self-clocked dynamic comparator further includes a pre-amplifier (PRE-AMP) configured to output an enable (TRI) signal based on a comparison between the VIN
(Continued)

and an adjusted VREF, and a logic gate configured to receive the TRI signal and one of the OUT+ signal and OUT− signal, and configured to output the CLKsf signal. The cycles of the CLKsf signal cause the latch to dissipate energy.

20 Claims, 9 Drawing Sheets

(56) References Cited

U.S. PATENT DOCUMENTS

| | | | | |
|---|---|---|---|---|
| 8,749,274 | B1* | 6/2014 | Dasgupta | H03K 5/24 327/75 |
| 9,395,746 | B2* | 7/2016 | Chung | G06F 1/10 |
| 10,601,409 | B2* | 3/2020 | Poulton | H03K 5/135 |
| 2006/0119401 | A1* | 6/2006 | Kitagawa | H03K 19/0008 327/74 |
| 2013/0156126 | A1 | 6/2013 | Chung et al. | |
| 2014/0062569 | A1 | 3/2014 | Ghatak | |
| 2016/0142046 | A1 | 5/2016 | Powell | |
| 2017/0222845 | A1 | 8/2017 | Zerbe et al. | |
| 2018/0226961 | A1 | 8/2018 | Shimauchi et al. | |
| 2019/0081635 | A1* | 3/2019 | Kurahashi | H03M 1/468 |
| 2021/0058080 | A1* | 2/2021 | Kim | H03B 5/364 |

FOREIGN PATENT DOCUMENTS

| | | |
|---|---|---|
| CN | 110391796 A | 10/2019 |
| CN | 110474623 A | 11/2019 |
| RU | 2014136729 A | 12/2014 |

OTHER PUBLICATIONS

Abbas, Mohamed, et al. "Clocked comparator for high-speed applications in 65nm technology." 2010 IEEE Asian Solid-State Circuits Conference. IEEE, Beijing, China, Nov. 8-10, 2010.
Abdel-Hafeez, Saleh, and Ali Shatnawi. "High-Speed Low-Power Flash ADC Architecture Using Switched-Capacitor Positive Feedback Comparator and Parallel Single-Gate Encoder." Circuits, Systems, and Signal Processing 37.6 (2018): 2492-2510.
Ahmadi, Muhammad, and Won Namgoong. "Comparator power minimization analysis for SAR ADC using multiple comparators." IEEE Transactions on Circuits and Systems I: Regular Papers 62.10 (2015): 2369-2379.
Aihara, Kunia, et al. "Minimizing differential crosstalk of vias for high-speed data transmission." 2014 IEEE 23rd Conference on Electrical Performance of Electronic Packaging and Systems. IEEE, 2014.
Akita, Ippei, and Makoto Ishida. "A 0.06 mm 2 14nV/√ Hz chopper instrumentation amplifier with automatic differential-pair matching." 2013 IEEE International Solid-State Circuits Conference Digest of Technical Papers. IEEE, 2013.
Allen, Phillip E., and Douglas R. Holberg. "CMOS analog circuit design." Second edition. New York, Oxford, 2002.
Babayan-Mashhadi, Samaneh, and Reza Lotfi. "Analysis and design of a low-voltage low-power double-tail comparator." IEEE transactions on very large scale integration (vlsi) systems 22.2 (2014): 343-352.
Baradaranrezaeii, Ali, et al. "A 1GS/s low-power low-kickback noise comparator in CMOS process." 2011 20th European Conference on Circuit Theory and Design (ECCTD). IEEE, 2011.
Bowman, Keith, et al. "Dynamic variation monitor for measuring the impact of voltage droops on microprocessor clock frequency." IEEE Custom Integrated Circuits Conference 2010. IEEE, 2010.
Chan, Chi-Hang, et al. "A reconfigurable low-noise dynamic comparator with offset calibration in 90nm CMOS." IEEE Asian Solid-State Circuits Conference 2011. IEEE, 2011.
Chaudhari, Siddharth, et al. "Design of efficient Double Tail Comparator for Low Power." IEEE ICCSP 2015 Conference, 2015.

Wood Chiang, Shiuh-hua. "Comparator offset calibration using unbalanced clocks for high speed and high power efficiency." Electronics Letters 52.14 (2016): 1206-1207.
Cho, Thomas Byunghak, and Paul R. Gray. "A 10 b, 20 Msample/s, 35 mW pipeline A/D converter." IEEE journal of solid-state circuits 30.3 (1995): 166-172.
Cui, Shuguang, Andrea J. Goldsmith, and Ahmad Bahai. "Energy-efficiency of MIMO and cooperative MIMO techniques in sensor networks." IEEE Journal on selected areas in communications 22.6 (2004): 1089-1098.
Doernberg, Joey, Paul R. Gray, and David A. Hodges. "A 10-bit 5-Msample/s CMOS two-step flash ADC." IEEE Journal of Solid-State Circuits 24.2 (1989): 241-249.
Figueiredo, Pedro M., and Joao C. Vital. "Kickback noise reduction techniques for CMOS latched comparators." IEEE Transactions on Circuits and Systems II: Express Briefs 53.7 (2006): 541-545.
Gao, Junfeng, Guangjun Li, and Qiang Li. "High-speed low-power common-mode insensitive dynamic comparator." Electronics Letters 51.2 (2015): 134-136.
Goll, Bernhard, and Horst Zimmermann. "A 0.12 um CMOS Comparator Requiring 0.5 V at 600MHz and 1.5 V at 6GHZ." 2007 IEEE International Solid-State Circuits Conference. Digest of Technical Papers. IEEE, 2007.
Goll, Bernhard, and Horst Zimmermann. "A low-power 4GHz comparator in 120nm CMOS technology with a technique to tune resolution." 2006 Proceedings of the 32nd European Solid-State Circuits Conference. IEEE, 2006.
Gupta, Ashima, Anil Singh, and Alpana Agarwal. "A low-power high-resolution dynamic voltage comparator with input signal dependent power down technique." AEU-International Journal of Electronics and Communications 134 (2021): 153682.
Hajimiri, Ali, Sotirios Limotyrakis, and Thomas H. Lee. "Jitter and phase noise in ring oscillators." IEEE Journal of Solid-state circuits 34.6 (1999): 790-804.
Hazucha, Peter, et al. "A 233-MHz 80%-87% efficient four-phase DC-DC converter utilizing air-core inductors on package." IEEE Journal of Solid-State Circuits 40.4 (2005): 838-845.
He, Jun, et al. "Analyses of static and dynamic random offset voltages in dynamic comparators." IEEE Transactions on Circuits and Systems I: Regular Papers 56.5 (2009): 911-919.
Huang, Mu-Chen, and Shen-luan Liu. "A Fully Differential Comparator-Based Switched-Capacitor ΔΣ Modulator." IEEE Transactions on Circuits and Systems II: Express Briefs 56.5 (2009): 369-373.
Huang, Yu-Jie, et al. "A self-powered CMOS reconfigurable multi-sensor SoC for biomedical applications." IEEE Journal of Solid-State Circuits 49.4 (2014): 851-866.
Huang, Mo, et al. "20.4 An output-capacitor-free analog-assisted digital low-dropout regulator with tri-loop control." 2017 IEEE International Solid-State Circuits Conference (ISSCC). IEEE, 2017.
Huang, Chun-Po, Hsin-Wen Ting, and Soon-Jyh Chang. "Analysis of nonideal behaviors based on INL/DNL plots for SAR ADCs." IEEE Transactions on Instrumentation and Measurement 65.8 (2016): 1804-1817.
Hussain, Sarfraz, Rajesh Kumar, and Gaurav Trivedi. "Comparison and design of dynamic comparator in 180nm SCL technology for low power and high speed Flash ADC." 2017 IEEE International Symposium on Nanoelectronic and Information Systems (iNIS). IEEE, 2017.
Jain, Rinkle, and Seth Sanders. "A 200mA switched capacitor voltage regulator on 32nm CMOS and regulation schemes to enable DVFS." Proceedings of the 2011 14th European Conference on Power Electronics and Applications. IEEE, 2011.
Jeon, HeungJun, and Yong-Bin Kim. "A CMOS low-power low-offset and high-speed fully dynamic latched comparator." 23rd IEEE International SOC Conference. IEEE, 2010.
Jeon, HeungJun, and Yong-Bin Kim. "A novel low-power, low-offset, and high-speed CMOS dynamic latched comparator." Analog Integrated Circuits and Signal Processing 70.3 (2012): 337-346.
Johns, David A., and Ken Martin. Analog integrated circuit design. John Wiley & Sons, 2008.
Judy, Mohsen, and Jeremy Holleman. "A fast convergent and energy efficient offset calibration technique for dynamic comparators."

(56) References Cited

OTHER PUBLICATIONS

2017 IEEE 60th International Midwest Symposium on Circuits and Systems (MWSCAS). IEEE, 2017.
Jung, Y., et al. "Low-power and low-offset comparator using latch load." Electronics Letters 47.3 (2011): 1-2.
Kandpal, Kavindra, Saloni Varshney, and Manish Goswami. "A high speed-low power comparator with composite cascode pre-amplification for oversampled ADCs." Journal of Automation and Control Engineering vol. 1, No. 4 (2013): 301-305.
Kazeminia, Sarang, et al. "A 500 MS/s 600 µW 300 µm 2 single-stage gain-improved and kickback noise rejected comparator in 0.35 µm 3.3 v CMOS Process." IEICE transactions on electronics 94.4 (2011): 635-640.
Khorami, Ata, et al. "A low-power dynamic comparator for low-offset applications." Integration 69 (2019): 23-30.
Khorami, Ata, and Mohammad Sharifkhani. "Excess power elimination in high-resolution dynamic comparators." Microelectronics journal 64 (2017): 45-52.
Khorami, Ata, and Mohammad Sharifkhani. "High-speed low-power comparator for analog to digital converters." AEU-International Journal of Electronics and Communications 70.7 (2016): 886-894.
Kim, Sung Justin, Doyun Kim, and Mingoo Seok. "Comparative study and optimization of synchronous and asynchronous comparators at near-threshold voltages." 2017 IEEE/ACM International Symposium on Low Power Electronics and Design (ISLPED). IEEE, 2017.
Kinget, Peter R. "Device mismatch and tradeoffs in the design of analog circuits." IEEE Journal of Solid-State Circuits 40.6 (2005): 1212-1224.
Kudva, Sudhir S., et al. "A switching linear regulator based on a fast-self-clocked comparator with very low probability of meta-stability and a parallel analog ripple control module." 2018 IEEE Custom Integrated Circuits Conference (CICC). IEEE, 2018.
Kudva, Sudhir S., et al. "Current parking regulator for zero droop/ overshoot load transient response." 2016 IEEE Applied Power Electronics Conference and Exposition (APEC). IEEE, 2016.
Kudva, Sudhir S., and Ramesh Harjani. "Fully integrated capacitive DC-DC converter with all-digital ripple mitigation technique." IEEE Journal of Solid-State Circuits 48.8 (2013): 1910-1920.
Li, Min Jun, et al. "A High-gain High-precision Dynamic Comparator with Dynamic Cascading Technique." 2019 Photonics & Electromagnetics Research Symposium-Fall (PIERS-Fall). IEEE, 2019.
López-Martín, Antonio J., et al. "Low-voltage super class AB CMOS OTA cells with very high slew rate and power efficiency." IEEE Journal of Solid-State Circuits 40.5 (2005): 1068-1077.
Lu, Junjie, and Jeremy Holleman. "A low-power high-precision comparator with time-domain bulk-tuned offset cancellation." IEEE Transactions on Circuits and Systems I: Regular Papers 60.5 (2013): 1158-1167.
Matsuzawa, Akira. "High speed and low power ADC design with dynamic analog circuits." 2009 IEEE 8th International Conference on ASIC. IEEE, 2009.
Moni, D. Jackuline, and P. Jisha. "High-speed and low-power dynamic latch comparator." 2012 International Conference on Devices, Circuits and Systems (ICDCS). IEEE, 2012.
Nagy, Lukas, et al. "An ultra low-voltage rail-to-rail comparator for on-chip energy harvesters." AEU-International Journal of Electronics and Communications 108 (2019): 10-18.
Namdari, Ali, and Mehdi Dolatshahi. "A new ultra low-power, universal OTA-C filter in subthreshold region using bulk-drive technique." AEU-International Journal of Electronics and Communications 82 (2017): 458-466.
Nasiri, Hamed, and Abdolreza Nabavi. "A 1.8 V 3 GS/s 7-bit time-interleaved Quasi C-2C SAR ADC using voltage-comparator time-information." AEU-International Journal of Electronics and Communications 83 (2018): 138-149.
Navid, Reza, et al. "A 40 GB/s serial link transceiver in 28 nm CMOS technology." IEEE Journal of Solid-State Circuits 50.4 (2014): 814-827.
Okazawa, Takayuki, Ippei Akita, and Makoto Ishida. "A digitally calibrated dynamic comparator using time-domain offset detection." Analog Integrated Circuits and Signal Processing 81.3 (2014): 561-570.
Paik, Daehwa, Masaya Miyahara, and Akira Matsuzawa. "An analysis on a dynamic amplifier and calibration methods for a pseudo-differential dynamic comparator." IEICE Transactions on Fundamentals of Electronics, Communications and Computer Sciences 95.2 (2012): 456-470.
Paik, Daehwa, Masaya Miyahara, and Akira Matsuzawa. "An analysis on a pseudo-differential dynamic comparator with load capacitance calibration." 2011 9th IEEE International Conference on ASIC. IEEE, 2011.
Poujois, Robert, and Joseph Borel. "A low drift fully integrated MOSFET operational amplifier." IEEE Journal of Solid-State Circuits 13.4 (1978): 499-503.
Rabaey, J. M., A. Chandrakasan, and B. Nikolic. "The CMOS inverter." Digital integrated circuits. (2003): 179-233.
Ramadan, Khalil F., et al. "Node-power-based MAC protocol with adaptive listening period for wireless sensor networks." AEU-International Journal of Electronics and Communications 84 (2018): 46-56.
Ramadass, Yogesh, et al. "A 0.16 mm 2 completely on-chip switched-capacitor DC-DC converter using digital capacitance modulation for LDO replacement in 45nm CMOS." 2010 IEEE International Solid-State Circuits Conference-(ISSCC). IEEE, 2010.
Razavi, Behzad, and Bruce A. Wooley. "Design Techniques for High-Speed, High-Resolution Comparators." IEEE Journal of Solid-State Circuits 27.12 (1992): 1916-1926.
Restu, Wan Irma Idayu, Binti Wan Mohd Nasir, and Md Mamun Bin Ibne Reaz. "Low power and high speed CMOS current comparators." 2016 International Conference on Advances in Electrical, Electronic and Systems Engineering (ICAEES). IEEE, 2016.
Saggini, Stefano, Massimo Ghioni, and Angelo Geraci. "An innovative digital control architecture for low-voltage, high-current dc-dc converters with tight voltage regulation." IEEE Transactions on power Electronics 19.1 (2004): 210-218.
Salem, Loai G., Julian Warchall, and Patrick P. Mercier. "20.3 A 100nA-to-2mA successive-approximation digital LDO with PD compensation and sub-LSB duty control achieving a 15.1 ns response time at 0.5 V." 2017 IEEE International Solid-State Circuits Conference (ISSCC). IEEE, 2017.
Salem, Loai, and Yehea Ismail. "Gain-band self-clocked comparator for DC-DC converters hysteretic control." 2010 International Conference on Energy Aware Computing. IEEE, 2010.
Saurabh, A. Malik A, and P. Srivastava. "New improved high speed low power double tail comparator design for 2.5 GHz input signal." Proceedings of the 2014 IEEE Students' Technology Symposium. IEEE, 2014.
Schinkel, Daniel, et al. "A double-tail latch-type voltage sense amplifier with 18ps setup+ hold time." 2007 IEEE International solid-state circuits conference. Digest of technical papers. IEEE, 2007.
Schreier, Richard, et al. "Design-oriented estimation of thermal noise in switched-capacitor circuits." IEEE Transactions on Circuits and Systems I: Regular Papers 52.11 (2005): 2358-2368.
Seeman, Michael Douglas. A design methodology for switched-capacitor DC-DC converters. University of California, Berkeley, 2009.
Shahpari, Nima, Rasul Dehghani, and Payam Rabani. "A process and temperature robust constant-gm input/output rail-to-rail op-amp." Microelectronics Journal 46.6 (2015): 506-512.
Shahpari, Nima, and Mehdi Habibi. "A rail-to-rail low-power latch comparator with time domain bulk-tuned offset cancellation for low-voltage applications." International Journal of Circuit Theory and Applications 46.11 (2018): 1968-1984.
Shahpari, Nima, Mehdi Habibi, and Piero Malcovati. "An early shutdown circuit for power reduction in high-precision dynamic comparators." AEU-International Journal of Electronics and Communications 118 (2020): 153144.

(56) References Cited

OTHER PUBLICATIONS

Sheikhaei, Samad, Shahriar Mirabbasi, and Andre Ivanov. "A 0.35/spl mu/m CMOS comparator circuit for high-speed ADC applications." 2005 IEEE International Symposium on Circuits and Systems. IEEE, 2005.
Shirai, Eiji. "CMOS multistage preamplifier design for high-speed and high-resolution comparators." IEEE Transactions on Circuits and Systems II: Express Briefs 54.2 (2007): 166-170.
Singh, Teja, et al. "3.2 Zen: A next-generation high-performance× 86 core." 2017 IEEE International Solid-State Circuits Conference (ISSCC). IEEE, 2017.
Staszewski, Robert Bogdan, et al. "All-digital PLL and transmitter for mobile phones." IEEE journal of Solid-State circuits 40.12 (2005): 2469-2482.
Straayer, Matthew Z., and Michael H. Perrott. "A multi-path gated ring oscillator TDC with first-order noise shaping." IEEE Journal of Solid-State Circuits 44.4 (2009): 1089-1098.
Tabassum, Shabi, Anush Bekal, and Manish Goswami. "A low power preamplifier latch based comparator using 180nm CMOS technology." 2013 IEEE Asia Pacific Conference on Postgraduate Research in Microelectronics and Electronics (PrimeAsia). IEEE, 2013.
Tzeng, Te-Hsuen, et al. "A portable micro gas chromatography system for lung cancer associated volatile organic compound detection." IEEE Journal of Solid-State Circuits 51.1 (2015): 259-272.
Wang, Riyan, et al. "A high-speed high-resolution latch comparator for pipeline analog-to-digital converters." 2007 International Workshop on Anti-Counterfeiting, Security and Identification (ASID). IEEE, 2007.
Weigandt, Todd C., Beomsup Kim, and Paul R. Gray. "Analysis of timing jitter in CMOS ring oscillators." 1994 IEEE International Symposium on Circuits and Systems (ISCAS). vol. 4. IEEE, 1994.
Weste, Neil HE, and David Harris. CMOS VLSI design: a circuits and systems perspective. Pearson Education India, 2015.
Poulton, John W., et al. "A 1.17-pj/b, 25-GB/s/pin ground-referenced single-ended serial link for off-and on-package communication using a process-and temperature-adaptive voltage regulator." IEEE Journal of Solid-State Circuits 54.1 (2019): 43-54.
Wong, Yanyi Liu, Marc H. Cohen, and Pamela A. Abshire. "A 1.2-GHz comparator with adaptable offset in 0.35-µm CMOS." IEEE Transactions on Circuits and Systems I: Regular Papers 55.9 (2008): 2584-2594.
Wong, K-LJ, and C-KK Yang. "Offset compensation in comparators with minimum input-referred supply noise." IEEE Journal of Solid-State Circuits 39.5 (2004): 837-840.
Yip, Marcus, and Anantha P. Chandrakasan. "A resolution-reconfigurable 5-to-10-bit 0.4-to-1 V power scalable SAR ADC for sensor applications." IEEE Journal of Solid-State Circuits 48.6 (2013): 1-2.
Yuan, Jiren, and Christer Svensson. "A 10-bit 5-MS/s successive approximation ADC cell used in a 70-MS/s ADC array in 1.2-/spl mu/m CMOS." IEEE Journal of Solid-State Circuits 29.8 (1994): 866-872.
Yukawa, Akira. "A cmos 8-bit high-speed a/d converter ic." IEEE Journal of Solid-State Circuits 20.3 (1985): 775-779.
Zhang, Yulin, Edoardo Bonizzoni, and Franco Maloberti. "A 10-b 200-kS/s 250-nA self-clocked coarse-fine SAR ADC." IEEE Transactions on Circuits and Systems II: Express Briefs 63.10 (2016): 924-928.
Razavi, Behzad, "Design of Analog CMOS Integrated Circuits," 2nd ed., McGraw-Hill Education @2017.
Träff, H., "Novel Approach to High Speed CMOS Current Comparators," Electronics Letters 28.3 (1992): 310-313.
Toumazou, Chris, et al. (eds.),"Trade-Offs in Analog Circuit Design: The Designer's Companion, Part 1," Springer Science & Business Media, 2002 ISBN 978-1-4020-7037-2, pp. 407-441.
Okazawa, Takayuki, and Ippei Akita, "A Dynamic Latched Comparator Using Area-Efficient Stochastic Offset Voltage Detection Technique," IEICE Transactions on Fundamentals of Electronics E101-C,5 (2018): 396-403.
International Search Report and Written Opinion, International Application No. PCT/US/2020/055058, dated Jan. 14, 2021, 8 pages.
Miyahara, et al., "A Low-Noise Self-Calibrating Dynamic Comparator for High-Speed ADCs," 2008 IEEE Asian Solid-State Circuits Conference, IEEE, Dec. 12, 2008, pp. 269-272, [online] <https://ieeexplore.ieee.org/abstract/document//4708780>.
Dey, "A Multi-Time Over Threshold Data Acquisition System for Silicon Photomultipliers Based Positron Emission Tomography Imaging," Diss. published Feb. 4, 2020, Ch. 6, [online] <https://digital.lib.washington.edu/researchworks/handle/1773/45084>.

\* cited by examiner

INPUT DRIVEN SELF-CLOCKED DYNAMIC COMPARATOR

CROSS-REFERENCE(S) TO RELATED APPLICATION(S)

This application is a National Stage of International Application No. PCT/US2020/055058 filed Oct. 9, 2020, which claims priority to U.S. Provisional Patent Application No. 62/914,400, filed Oct. 11, 2019, which is incorporated by reference herein in its entirety.

FEDERAL FUNDING STATEMENT

This invention was made with government support under Grant No. R01 EB002117, awarded by the National Institutes of Health. The government has certain rights in the invention.

BACKGROUND

Ultra-low power sensor networks have been a steady topic of research. These networks can be used in a wide range of applications—biomedical, security, autonomous navigation and time-of-flight imaging. Generally, these applications require highly power-efficient analog-to-digital converters (ADCs) to digitize the acquired analog signals. A key building block in virtually all ADC architectures and mixed-signal electronics is a comparator, which contributes majority of the energy consumption. For example, 50-60% of the energy consumption in a Successive Approximation Register (SAR) ADC may come from the comparator. With technology scaling, this problem becomes more acute because the low voltage operation imposes stringent requirements on the quantization noise of the comparator.

The most common comparator architecture used in converters is called a strong-arm latch, owing to its strong positive feedback required for fast decisions, zero static power consumption, and full swing outputs. The power consumed by the latch arises primarily from the charging and discharging of the internal node capacitances. This switching power dissipation is expressed as $P=CV_{DD}^2 f_{CLK}$, where $f_{CLK}$ is the clock frequency, C is the capacitance of the circuit and $V_{DD}$ is the supply voltage.

A number of methods have been proposed to reduce this switching power. Most of these techniques attempt to reduce the signal swings across the nodes. However, these methods may still result in excessive power dissipation of the comparator. Accordingly, systems and methods are needed for comparators with reduced power dissipation in order to support ultra-low power sensor networks.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one embodiment, a self-clocked dynamic comparator includes: a latch configured to receive an input voltage (VIN), a reference voltage (VREF) and a clocking (CLKsf) signal. The comparator is configured to output a first rail-to-rail output (OUT+) signal and a second rail-to-rail output (OUT−) signal. A pre-amplifier (PRE-AMP) is configured to output an enable (TRI) signal based on a comparison between the VIN and an adjusted VREF. A logic gate is configured to receive the TRI signal and one of the OUT+ signal and OUT− signal, and configured to output the CLKsf signal. The cycles of the CLKsf signal control operation of the comparator and a power dissipation of the comparator.

In one aspect, the self-clocked dynamic comparator of claim 1, where the adjusted VREF is VREF-Δv. In another aspect, the logic gate is an AND gate. In yet another aspect, the AND gate is configured to receive the OUT− signal.

In one embodiment, the adjusted VREF is a first adjusted VREF, where the PRE-AMP is a first PRE-AMP, the AND gate is a first AND gate, and the TRI signal is a first TRI signal. The self-clocked dynamic comparator further includes a second PRE-AMP configured to output a second TRI signal based on a comparison between the VIN and a second adjusted VREF that is VREF+Δv.

In one aspect, the self-clocked dynamic comparator also includes a second AND gate configured to receive the second TRI signal and the OUT+ signal, and configured to output the CLKsf signal. In one aspect, the self-clocked dynamic comparator also includes an OR gate configured to receive a first OR input from the first AND gate and a second OR input from the second AND gate, and configured to output the CLKsf signal.

In one aspect, the CLKsf is configured to cycle when the VIN is inside a range from VREF-Δv to VREF+Δv, and the CLKsf is configured not to cycle when the VIN is outside the range from VREF-Δv to VREF+Δv.

In one aspect, the latch is configured to change its state when the VIN is inside a range from VREF-Δv to VREF+Δv. The latch is configured not to change its state when the VIN is outside the range from VREF-Δv to VREF+Δv.

In one embodiment, a self-clocked dynamic comparator includes: a latch configured to receive an input voltage (VIN), a reference voltage (VREF) and a clocking (CLKsf) signal. The latch is configured to output a first rail-to-rail output (OUT+) signal and a second rail-to-rail output (OUT−) signal. The self-clocked dynamic comparator also includes a first pre-amplifier (PRE-AMP) configured to output a first enable (TRI) signal based on a comparison between the VIN and VREF-Δv. A first AND gate is configured to receive the first TRI signal and one of the OUT− signal, and to output the CLKsf signal. A second PRE-AMP is configured to output a second TRI signal based on a comparison between the VIN and VREF+Δv. A second AND gate is configured to receive the second TRI signal and the OUT+ signal, and configured to output the CLKsf signal. The cycles of the CLKsf signal cause the latch to dissipate energy.

In one aspect, the self-clocked dynamic comparator also includes an OR gate configured to receive the first TRI signal and the second TRI signal, and configured to output the CLKsf signal. In one aspect, the CLKsf is configured to cycle when the VIN is inside a range from VREF-Δv to VREF+Δv, and the CLKsf is configured not to cycle when the VIN is outside the range from VREF-Δv to VREF+Δv.

In one aspect, the latch is configured to change its state when the CLKsf signal cycles.

In one embodiment, a method for operating a self-clocked dynamic comparator includes: comparing an input voltage (VIN) and an adjusted reference voltage (adjusted VREF) by a pre-amplifier (PRE-AMP); outputting an enable (TRI) signal by the PRE-AMP, where the TRI signal is based on a comparison between the VIN and the adjusted VREF; comparing the TRI signal and one of a first rail-to-rail output (OUT+) signal and a second rail-to-rail output (OUT−) signal by an AND gate; outputting a clocking (CLKsf) signal by the AND gate; receiving the VIN, a reference voltage (VREF) and the CLKsf signal by a latch; and outputting the OUT+ signal and the OUT− signal by the latch. The cycles of the CLKsf signal cause the latch to dissipate energy.

In one aspect, the adjusted VREF is VREF−Δv.

In another aspect, the AND gate is configured to receive the OUT− signal.

In one aspect, the adjusted VREF is a first adjusted VREF, the PRE-AMP is a first PRE-AMP, the AND gate is a first AND gate, and the TRI signal is a first TRI signal. The method also includes: comparing the VIN and a second adjusted VREF that is VREF+Δv by a second PRE-AMP; outputting a second TRI signal by the second PRE-AMP, where the second TRI signal is based on a comparison between the VIN and VREF+Δv; and receiving the second TRI signal and the OUT+ signal by a second AND gate.

In one aspect, the method also includes: comparing the first TRI signal and the second TRI signal by an OR gate; and outputting the CLKsf signal by the end gate.

In one aspect, the CLKsf is configured to cycle when the VIN is inside a range from VREF−Δv to VREF+Δv, where the CLKsf is configured not to cycle when the VIN is outside the range from VREF−Δv to VREF+Δv.

In one aspect, the latch is configured to change its state when the VIN is inside a range from VREF−Δv to VREF+Δv, and the latch is configured not to change its state when the VIN is outside the range from VREF−Δv to VREF+Δv.

DESCRIPTION OF THE DRAWINGS

The foregoing aspects and the attendant advantages of the inventive technology will be more readily appreciated as the same become better understood by reference to the following detailed description, when taken in conjunction with the accompanying drawings, wherein.

DETAILED DESCRIPTION

While illustrative embodiments have been described, it will be appreciated that various changes can be made therein without departing from the spirit and scope of the invention.

The inventive technology reduces the switching power of a dynamic comparator by using an input driven self-clocking mechanism. Unlike the dynamic comparators of the conventional technology that are on all the time, the dynamic comparator of the inventive technology is enabled only during predetermined periods of time. In some embodiments, the dynamic comparator has the clock enabled only when the input voltage VIN is within a voltage range from VREF−Δv to VREF+Δv, while outside this range the dynamic comparator has no switching activity, therefore reducing the overall power dissipation of the latch, and, consequently, reducing the power dissipation of the comparator.

In some embodiments, the dynamic comparator includes one pair of pre-amplifier and AND gate for the voltage window VREF−Δv to VREF, and another pair of pre-amplifier and AND gate for the voltage window VREF to VREF+Δv. The two outputs from the two pairs of components may be fed to the latch through an OR gate. In different embodiments, different combinations of logic gates (AND, OR, NOR, NAND, etc.) may be used to achieve an equivalent output, that is, clocking the comparator only during certain relevant voltage windows to reduce the power dissipation.

Figure 1A:
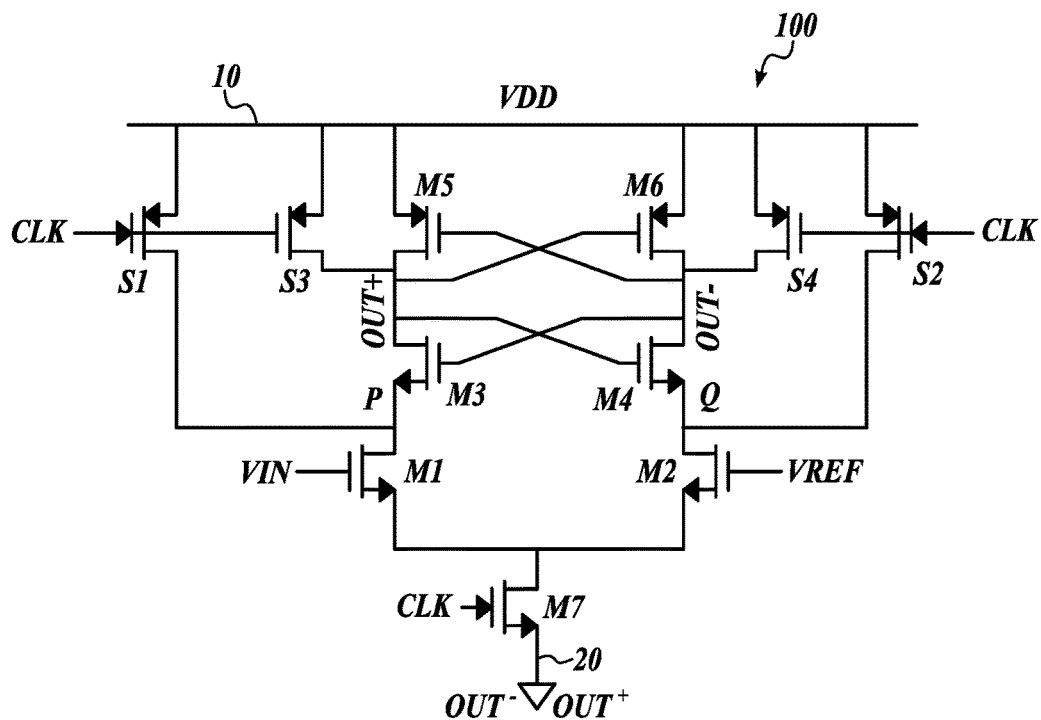
FIG. 1A illustrates a comparator in accordance with conventional technology.

FIG. 1A illustrates a comparator 100 in accordance with conventional technology. The comparator (also referred to as a latch) 100 operates based on an external clock signal CLK that causes continuous charging and discharging of the capacitance irrespective of the voltages VIN1 and VIN2. The comparator 100 includes a clocked differential pair, M1-M2, two cross-coupled pairs, M3-M4 and M5-M6, an nmos tail device M7 and four precharge switches, S1-S4. The tail device M7 and the precharge switches are controlled by the CLK signal. Depending on the polarity of VIN1−VIN2, the circuit provides rail-to-rail outputs 20 at OUT+ and OUT−.

Figure 1B:
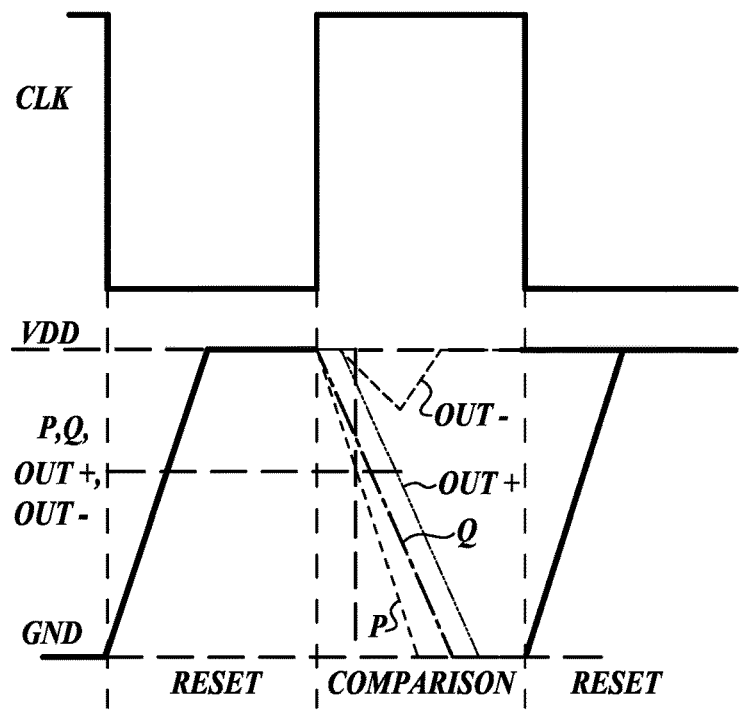
FIGS. 1B and 1C illustrate operation of the comparator in accordance with conventional technology.

FIG. 1B illustrates operation of the comparator in accordance with conventional technology. The horizontal axis denotes time, and the vertical axis denotes signals. The overall circuit operation can be divided into two phases—reset and comparison. During the reset phase, CLK signal is low and switches S1-S4 charge the nodes P, Q, OUT+ and OUT− to VDD. The reset phase ends and the comparison phase begins when the CLK signal turns high. In this phase, the precharge switches are turned off, while M7 turns on providing current paths for the clocked differential pair M1, M2. In response, M1 and M2 turn on, drawing a differential current proportional to |VIN1−VREF|. This current starts to discharge nodes P and Q, and thus |VP−VQ| grows. When VP and VQ fall below VDD−VTHN (VTHN is the threshold voltage of M3 and M4), the switches nmos cross-coupled pair turns on and starts to discharge nodes X and Y. When VX and VY fall below VDD−|VTHP|(VTHP is the threshold voltage of M5 and M6), the pmos cross coupled pair turns on and the circuit enters the latch phase. The positive feedback around the cross coupled pairs eventually brings one output back to VDD and allows the other output to fall to zero. The cycle repeats when CLK becomes low.

Figure 1C:
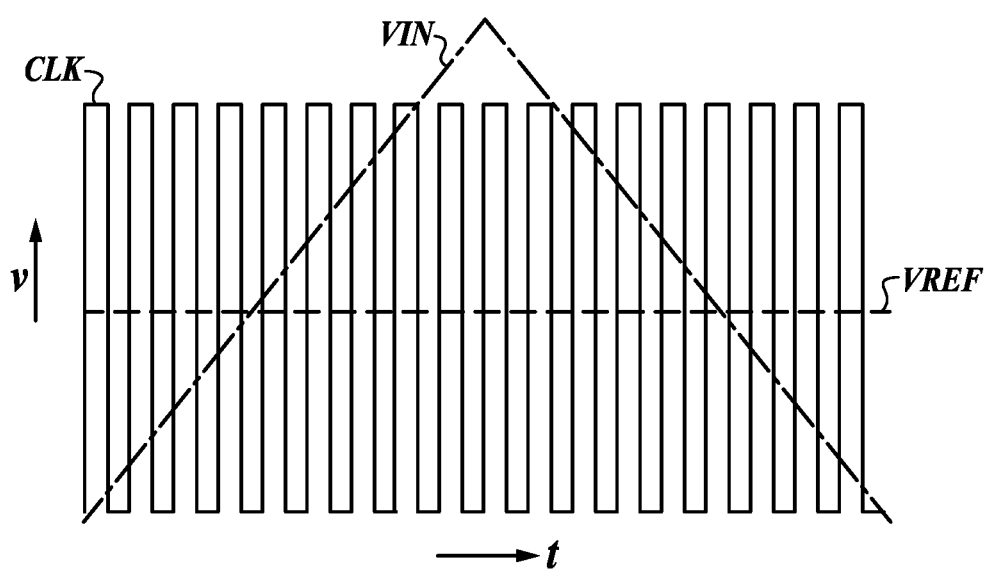

FIG. 1C illustrates operation of the comparator 100 in accordance with conventional technology. The comparator 100 operates using an external clock CLK. Because of the switching states of the CLK signal, the capacitance of the comparator 100 continuously charges and discharges irrespective of the voltage difference between the input voltage VIN and reference voltage VREF. As explained above, this power dissipation may be expressed as $P=CV_{DD}^2 f_{CLK}$, where $f_{CLK}$ is frequency of the clock CLK, C is the capacitance of the circuit and $V_{DD}$ is the supply voltage.

Figure 2A:
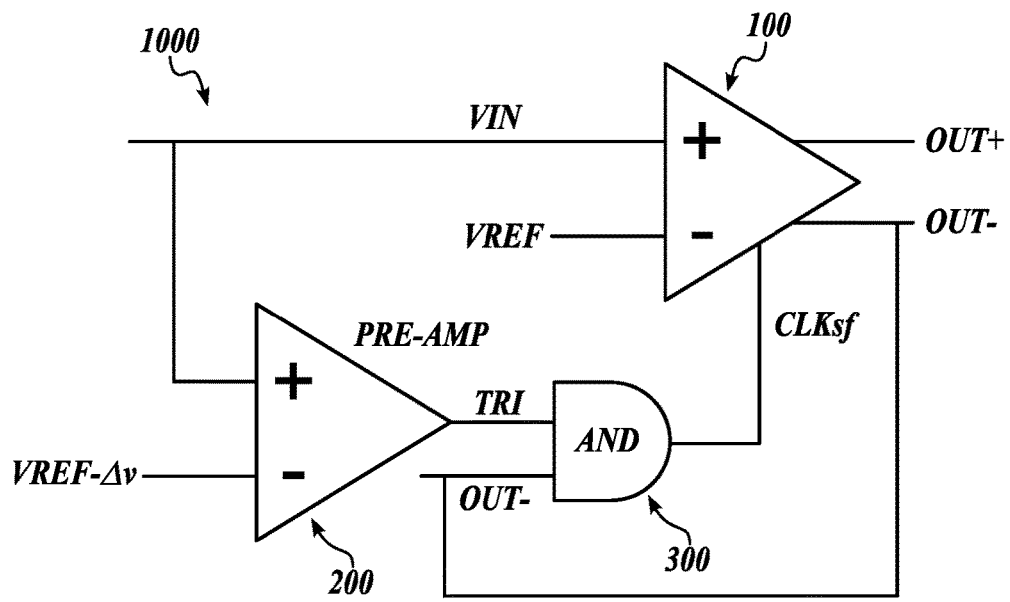
FIGS. 2A and 2B illustrate self-clocked dynamic comparators according to embodiments of inventive technology.

FIG. 2A illustrates a self-clocked dynamic comparator 1000 according to an embodiment of inventive technology. The illustrated embodiment operates on the rising edge of the input signal VIN. In some embodiments, the self-clocked dynamic comparator 1000 includes an AND gate 300 in addition to a conventional latch comparator 100 (also referred to as a Strong-arm latch comparator or a latch). In operation, the AND gate 300 generates the clock signal CLKsf that is fed to the latch comparator 100. The inputs to the AND gate 300 are one of the outputs of the latch comparator 100 (OUT− in this case) and an enable TRI signal (also referred to as enable EN signal).

The enable TRI signal may be generated by a pre-amp 200 (also referred to as a PRE-AMP) or another analogous component (e.g., different combinations of transistors). In some embodiments, the inputs to the pre-amp 200 are VIN as a non-inverting input and VREF−Δv as an inverting input. Therefore, when VIN is below VREF−Δv, the TRI signal out of the pre-amp 200 is low; and when VIN is above VREF−Δv, the TRI signal out of the pre-amp 200 is high. The TRI signal is fed to the AND gate 300 together with the OUT− signal form the latch 100. The resulting CLKsf signal is active (clocking) when the rising edge of VIN is between VREF−Δv and VREF. In absence of clocking (changing) of the CLKsf signal, the latch comparator 100 does not repeatedly charge and discharge the node capacitances, thereby reducing the overall power dissipation of the latch comparator.

Figure 2B:
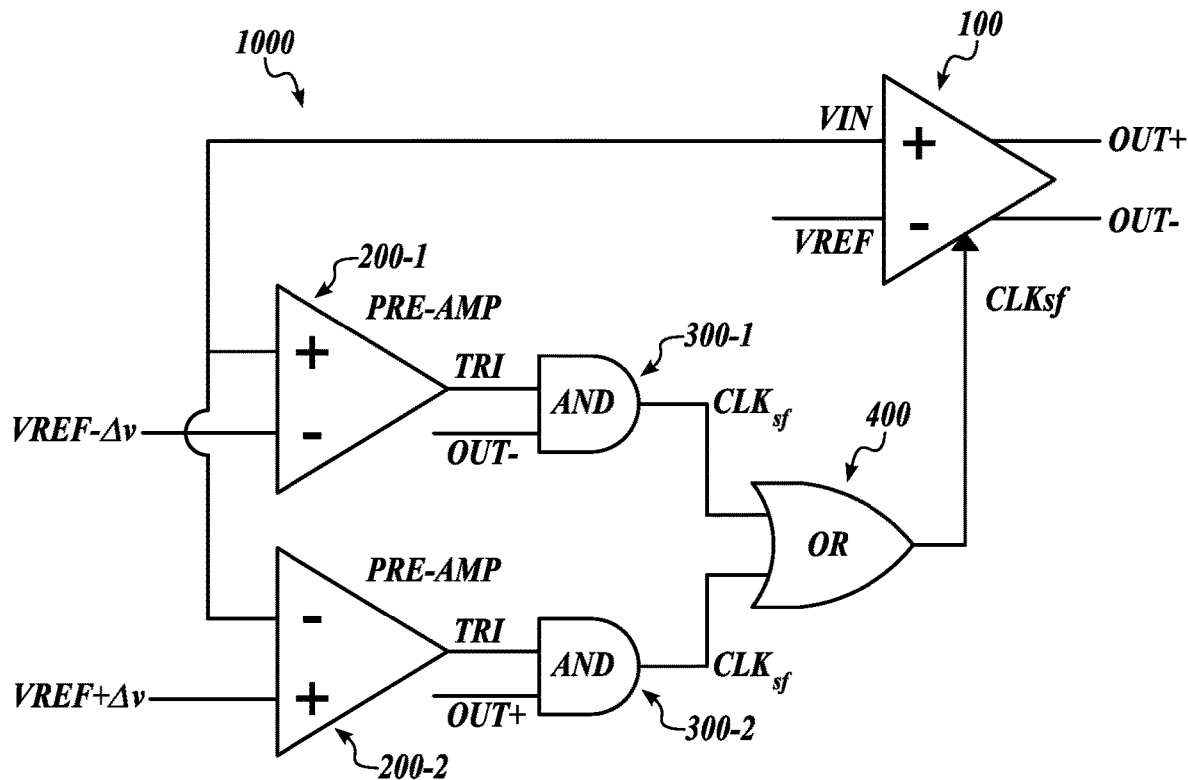

FIG. 2B illustrates a self-clocked dynamic comparator 1000 according to an embodiment of inventive technology. The illustrated embodiment operates with both the rising and falling edges of the input signal VIN. The operation of the dynamic comparator 1000 with respect to the rising edge of the input signal VIN is described in FIG. 2A, and corresponds to the operation of the PRE-AMP 200-1 and AND gate 300-1 in FIG. 2B. For the falling edge, additional pre-amplifier 200-2 and AND gate 300-2 are added to the circuit. The non-inverting input to the pre-amplifier 200-2 is VREF+Δv and the inverting input is VIN. The pre-amplifier 200-2 generates a trigger signal TRI when the input signal VIN goes below VREF+Δv. This trigger signal TRI is then fed to the AND gate 300-2 together with OUT+. The AND gate 300-2 gate produces CLKsf signal when the falling edge of VIN is between VREF+Δv and VREF. The resulting CLKsf signal is combined with the CLKsf signal from the AND gate 300-1 through an OR gate 400. The output of the OR gates serves as the clock signal CLKsf for the comparator 100. The overall CLKsf signal is described with respect to FIG. 2C below.

Figure 2C:
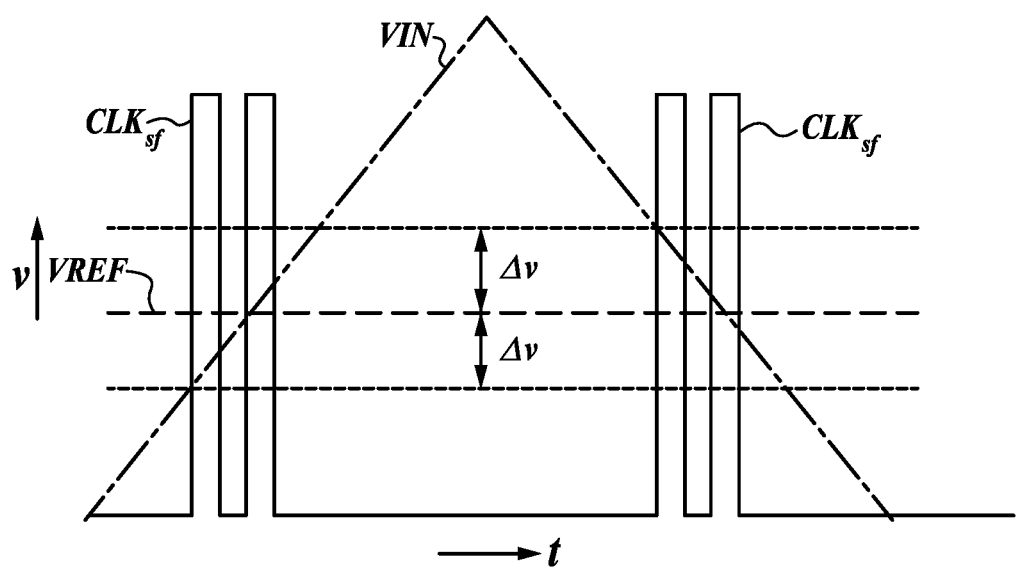
FIG. 2C illustrates operation of a self-clocked dynamic comparator according to an embodiment of inventive technology.

FIG. 2C illustrates operation of a self-clocked dynamic comparator according to an embodiment of inventive technology. The horizontal axis represents time, and the vertical axis represents voltage of the VIN and CLKsf signals. As shown in the FIG. 2C, the CLKsf signal clocks within relatively narrow ranges of the VIN signal around the VREF, while being disabled outside of these narrow ranges. In some embodiments, these narrow ranges for clocking the CLKsf signal are VREF−Δv to VREF for the rising edge of VIN, and VREF+Δv to VREF for the falling edge of the VIN. Such limited activity of the CLKsf signal helps to reduce the switching power dissipation caused by charging and discharging of the capacitances of the latch 100.

In some embodiments, the elements of the self-clocking comparator 1000 operate without a need to route the clock to another circuit block. As a result, the parasitic capacitance loading the self-clocking circuit 1000 is further minimized in comparison to a traditional comparator using an externally generated clock CLK. Therefore, the self-clocking dynamic comparator 1000 may improve the decision speed of the dynamic comparator by having a higher clock speed than a traditional comparator using an externally generated clock.

Figure 3:
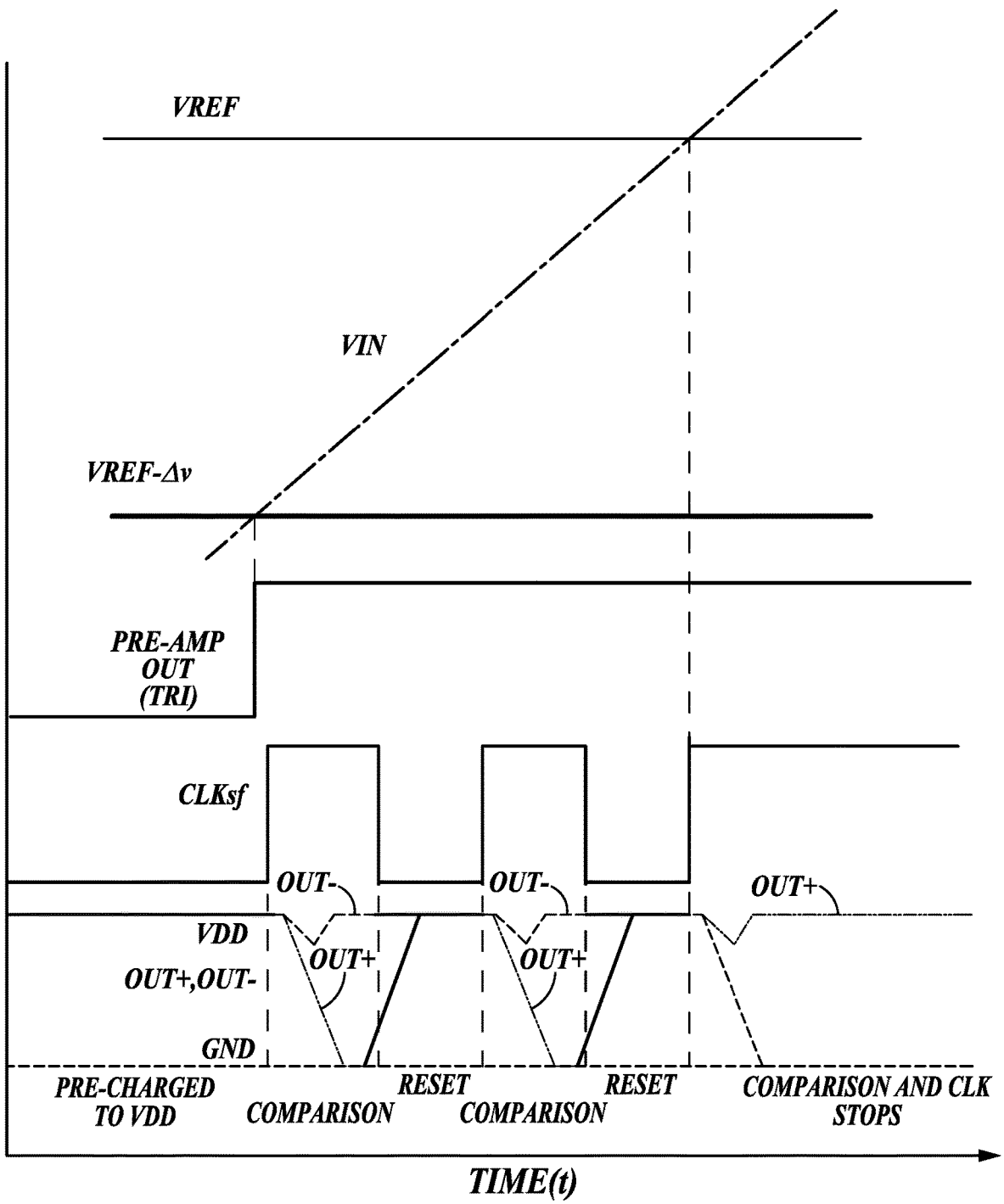
FIG. 3 illustrates operation of a self-clocked dynamic comparator according to an embodiment of inventive technology.

FIG. 3 illustrates operation of a self-clocked dynamic comparator according to an embodiment of inventive technology. The horizontal axis represents elapsed time, and the vertical axis represents voltages of different signals. The illustrated signals correspond to the rising edge of VIN, however an analogous graph may be constructed for the falling edge of VIN.

As explained with reference to FIG. 2A, the AND gate generates clock signal CLKsf for the comparator. When TRI is low, CLKsf is low and the switches charge the nodes P, Q, OUT+ and OUT− to VDD. When TRI is high, CLKsf becomes high. This turns M7 on and the switches S1-S4 off, which starts the comparison phase. Nodes P and Q are discharged by M1 and M2 depending on |VIN-VREF|, and when they fall below VDD−VTHN, the NMOS cross-coupled transistors are turned on. At this point, discharging of nodes X and Y start, and when they fall below VDD−|VTHP|, the PMOS cross coupled pair turns on. As long as VIN<VREF, OUT− gets discharged to zero while OUT+ gets restored to VDD. OUT− becoming zero makes CLKsf zero as well. Therefore, the PMOS switches are turned on again and the nodes are charged back to VDD. In response, OUT− becomes VDD again, and this makes CLKsf high. Thus, the comparator is ready for evaluation again. The cycle continues until VIN becomes sufficiently higher in magnitude in comparison to VREF, and OUT+ gets discharged to zero at the end of the latch regeneration phase. When this happens, OUT− gets restored to VDD and hence, CLKsf stays high. This stops the comparator operation and prevents any more power draw from power supply. For the falling edge, an extra pre-amplifier is used, as shown in FIG. 2B. This pre-amplifier 200-2 generates a trigger signal when the input signal goes below (VREF+Δv). This trigger signal is then fed to the AND gate 300-2 together with OUT+. The two AND gates are then combined using an OR gate. The output of the OR gates serves as the clock signal CLKsf for the comparator.

Figure 4A:
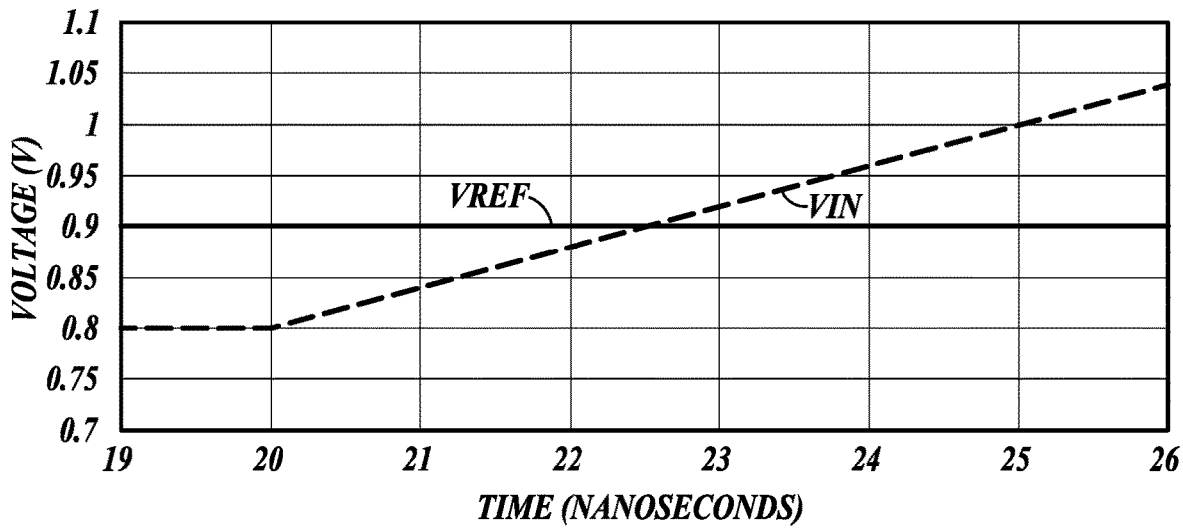
FIGS. 4A and 4B are simulations of the comparator in accordance with conventional technology.
Figure 4B:
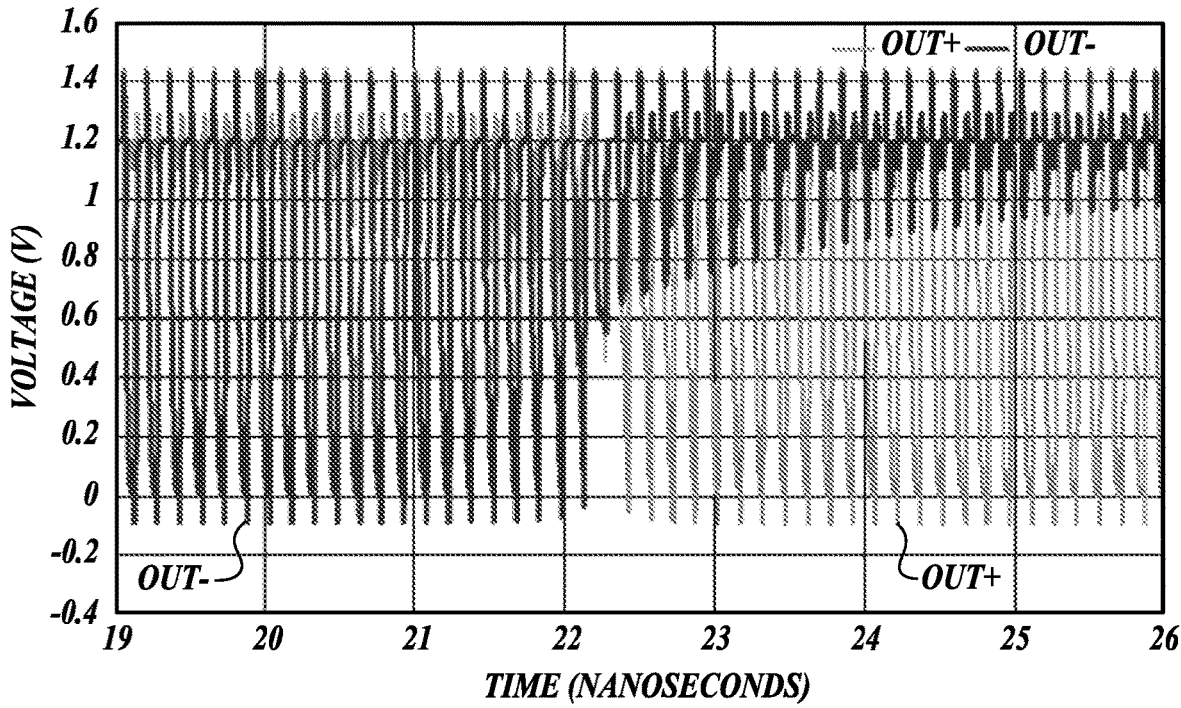

FIGS. 4A and 4B are simulations of the dynamic comparator in accordance with conventional technology. An example of such conventional dynamic comparator 100 is shown in FIG. 1A. The horizontal axes of FIGS. 4A and 4B indicate time in nanoseconds, and the vertical axes show signal strength in Volts. The input signal has a rise time of 1 nanosecond, ramping from 800 mV to 1.2V. The reference voltage for the test bench is 900 mV and Δv is 50 mV. Here, the oscillation of the OUT+ and OUT− continues through the entire operation of the conventional comparator (latch). Such operation indicates continuous capacitive charging and discharging of the latch, resulting in continuous power dissipation.

Figure 5A:
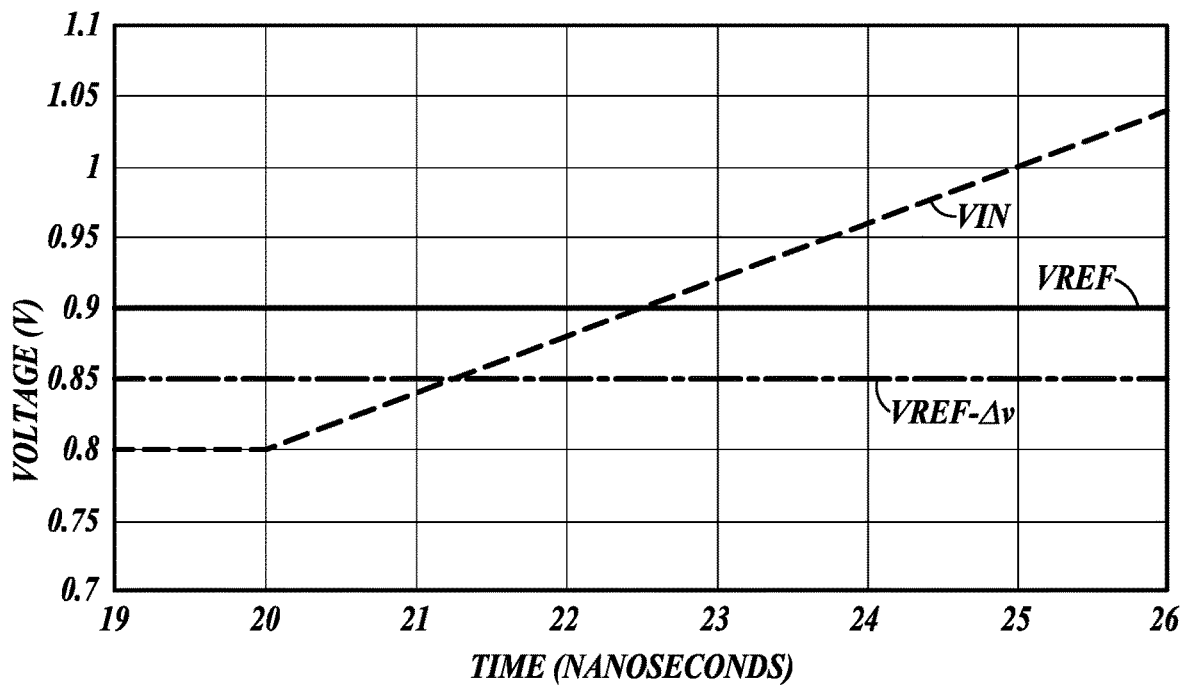
FIGS. 5A and 5B are simulations of a self-clocked dynamic comparator according to an embodiment of inventive technology.
Figure 5B:
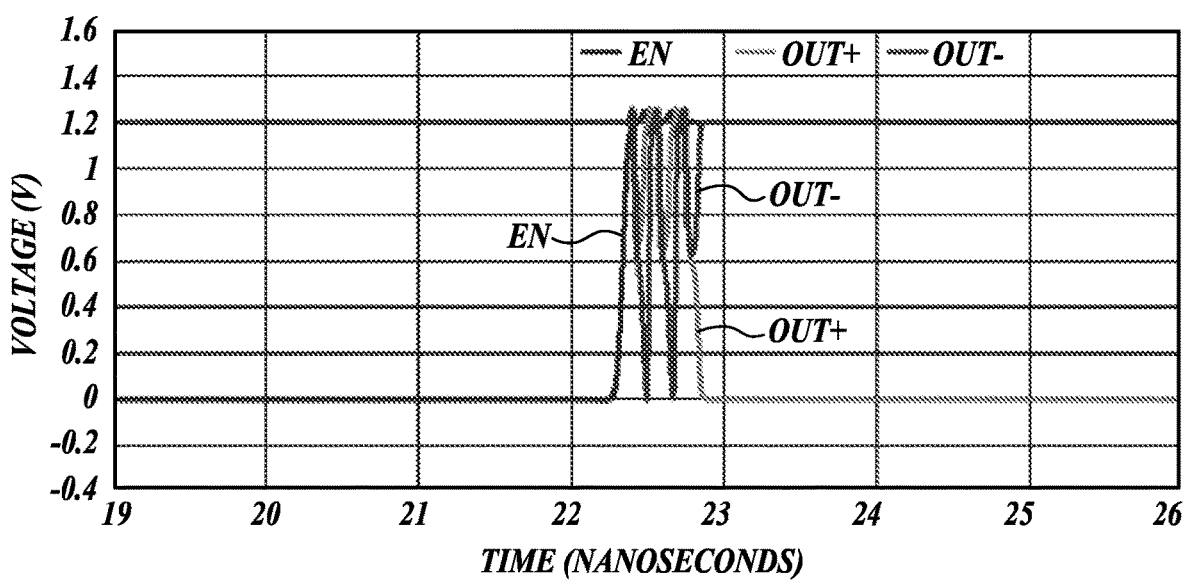

FIGS. 5A and 5B are simulations of a self-clocked dynamic comparator according to an embodiment of inventive technology. The horizontal axes of FIGS. 5A and 5B indicate time in nanoseconds, and the vertical axes show signal strength in Volts. The simulation includes the rising edge of VIN. Some embodiments of the corresponding circuitry are shown in FIGS. 2A and 2B above.

The simulation parameters (e.g., input signal rise time, ramping voltage, reference voltage, Δv) are the same as those in FIGS. 4A and 4B above. Simulated frequency of the clock for the self-clocked dynamic comparator is 7 GHz. The pre-amplifier generates a high output (TRI) when the non-inverting input signal becomes greater than about 850 mV (VREF−Δv) therefore enabling the self-clocked dynamic comparator. Before that, OUT+ and OUT− are both charged to VDD and the self-clocked dynamic comparator is ready for evaluation. Once the self-clocked dynamic comparator is triggered, OUT− gets discharged at the end of every latch phase for as long as VIN is less than VREF. When VIN exceeds VREF and the difference is enough to discharge OUT+, the AND gate output remains high and the clock stops, as shown in FIG. 5B. Stopping the clock disables the self-clocked dynamic comparator, which no longer draws current from the power supply. In many embodiments, such limited operation of the latch limits charging/discharging of the capacitance of the latch, therefore reducing power dissipation of the latch. Difference in power dissipation between the conventional and inventive technology is further discussed with respect to FIGS. 6 and 7 below.

Figure 6:
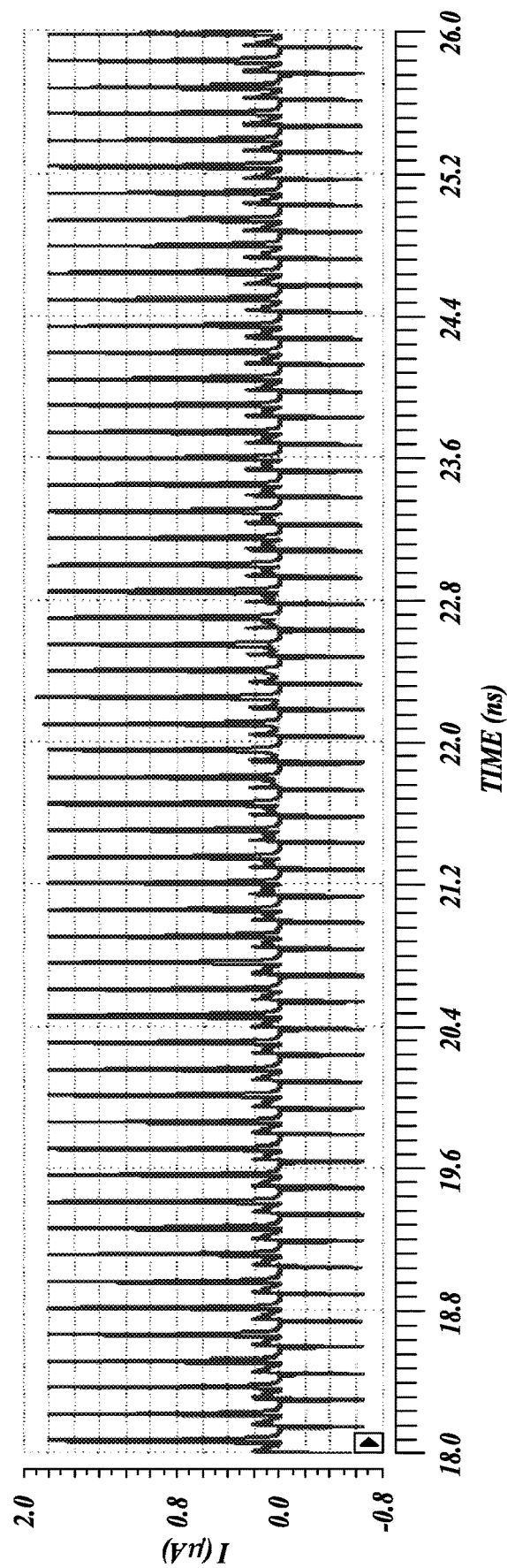
FIG. 6 is a simulation of the comparator in accordance with conventional technology.
Figure 7:
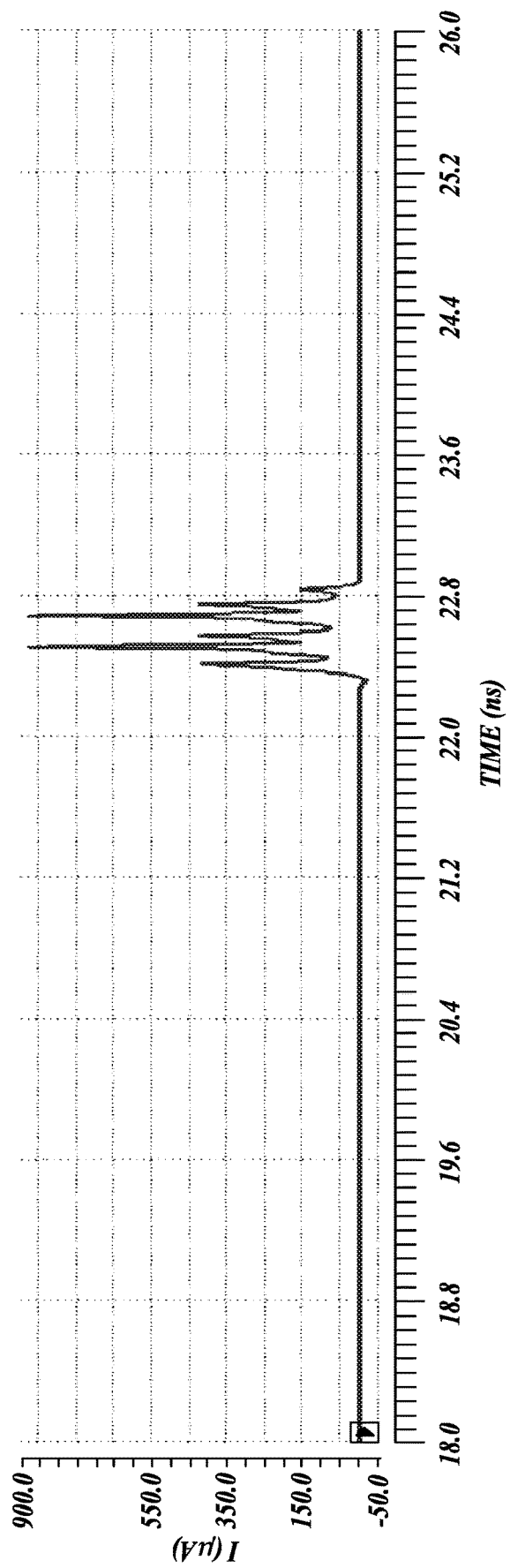
FIG. 7 is a simulation of a self-clocked dynamic comparator according to an embodiment of inventive technology.

FIGS. 6 and 7 are simulations of a conventional comparator and a self-clocked dynamic comparator according to an embodiment of inventive technology, respectively. The horizontal axes in both graphs indicate time, and vertical axes indicate current drawn from the power supply. The graphs are obtained using the same simulation testbench. For the conventional comparator (latch) 100, the current draw occurs all the time, owing to an uninterrupted clocking of the latch. For the self-clocked comparator 1000, there is no current consumption till the TRI signal triggers the comparator at around 22.2 ns. Once the self-clocking (CLKsf) starts operating and the self-clocked dynamic comparator 1000 starts evaluating, the current drawn from the supply fluctuates depending on the charging and discharging of the nodes. However, when the rising edge of the VIN gets outside of the range of VREF-Δv to VREF (and, equivalently, when the falling edge of the VIN gets outside of the range VREF+Δv to VREF), the self-clocked dynamic comparator 1000 stops the evaluation, which does not start until triggered by the TRI signal again.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, controller or data processor that is specifically programmed, configured or constructed to perform one or more of the computer-executable instructions described above.

Accordingly, the terms "computer" and "controller" as generally used herein refer to any data processor and can include Internet appliances and hand-held devices (including palm-top computers, wearable computers, cellular or mobile phones, multi-processor systems, processor-based or programmable consumer electronics, network computers, mini computers and the like).

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means+/−5% of the stated value.

For the purposes of the present disclosure, lists of two or more elements of the form, for example, "at least one of A, B, and C," is intended to mean (A), (B), (C), (A and B), (A and C), (B and C), or (A, B, and C), and further includes all similar permutations when any other quantity of elements is listed.

The invention claimed is:

1. A self-clocked dynamic comparator, comprising:
a latch configured to receive an input voltage (VIN), a reference voltage (VREF) and a clocking (CLKsf) signal, and configured to output a first rail-to-rail output (OUT+) signal and a second rail-to-rail output (OUT−) signal;
a pre-amplifier (PRE-AMP) configured to output an enable (TRI) signal based on a comparison between the VIN and an adjusted VREF; and
a logic gate configured to receive the TRI signal and one of the OUT+ signal and OUT− signal, and configured to output the CLKsf signal,
wherein cycles of the CLKsf signal control operation of the comparator and a power dissipation of the comparator.

2. The self-clocked dynamic comparator of claim 1, wherein the adjusted VREF is VREF-Δv.

3. The self-clocked dynamic comparator of claim 2, wherein the logic gate is an AND gate.

4. The self-clocked dynamic comparator of claim 3, wherein the AND gate is configured to receive the OUT− signal.

5. The self-clocked dynamic comparator of claim 4, wherein the adjusted VREF is a first adjusted VREF, wherein the PRE-AMP is a first PRE-AMP, wherein the AND gate is a first AND gate, and wherein the TRI signal is a first TRI signal, the self-clocked dynamic comparator further comprising:
a second PRE-AMP configured to output a second TRI signal based on a comparison between the VIN and a second adjusted VREF that is VREF+Δv.

6. The self-clocked dynamic comparator of claim 5, further comprising a second AND gate configured to receive the second TRI signal and the OUT+ signal, and configured to output the CLKsf signal.

7. The self-clocked dynamic comparator of claim 6, further comprising an OR gate configured to receive a first OR input from the first AND gate and a second OR input from the second AND gate, and configured to output the CLKsf signal.

8. The self-clocked dynamic comparator of claim 7, wherein the CLKsf is configured to cycle when the VIN is inside a range from VREF-Δv to VREF+Δv, and wherein the CLKsf is configured not to cycle when the VIN is outside the range from VREF-Δv to VREF+Δv.

9. The self-clocked dynamic comparator of claim 1, wherein the latch is configured to change its state when the VIN is inside a range from VREF-Δv to VREF+Δv, and wherein the latch is configured not to change its state when the VIN is outside the range from VREF-Δv to VREF+Δv.

10. A self-clocked dynamic comparator, comprising:
a latch configured to receive an input voltage (VIN), a reference voltage (VREF) and a clocking (CLKsf) signal, and configured to output a first rail-to-rail output (OUT+) signal and a second rail-to-rail output (OUT−) signal;

a first pre-amplifier (PRE-AMP) configured to output a first enable (TRI) signal based on a comparison between the VIN and VREF-$\Delta$v; and a first AND gate configured to receive the first TRI signal and one of the OUT- signal, and configured to output the CLKsf signal;

a second PRE-AMP configured to output a second TRI signal based on a comparison between the VIN and VREF+$\Delta$v; and a second AND gate configured to receive the second TRI signal and the OUT+ signal, and configured to output the CLKsf signal;

wherein cycles of the CLKsf signal cause the latch to dissipate energy.

11. The self-clocked dynamic comparator of claim 10, further comprising an OR gate configured to receive the first TRI signal and the second TRI signal, and configured to output the CLKsf signal.

12. The self-clocked dynamic comparator of claim 11, wherein the CLKsf is configured to cycle when the VIN is inside a range from VREF-$\Delta$v to VREF+$\Delta$v, and wherein the CLKsf is configured not to cycle when the VIN is outside the range from VREF-$\Delta$v to VREF+$\Delta$v.

13. The self-clocked dynamic comparator of claim 12, wherein the latch is configured to change its state when the CLKsf signal cycles.

14. A method for operating a self-clocked dynamic comparator, the method comprising:

comparing an input voltage (VIN) and an adjusted reference voltage (adjusted VREF) by a pre-amplifier (PRE-AMP);

outputting an enable (TRI) signal by the PRE-AMP, wherein the TRI signal is based on a comparison between the VIN and the adjusted VREF;

comparing the TRI signal and one of a first rail-to-rail output (OUT+) signal and a second rail-to-rail output (OUT-) signal by an AND gate;

outputting a clocking (CLKsf) signal by the AND gate;

receiving the VIN, a reference voltage (VREF) and the CLKsf signal by a latch; and outputting the OUT+ signal and the OUT- signal by the latch, wherein cycles of the CLKsf signal cause the latch to dissipate energy.

15. The method of claim 14, wherein the adjusted VREF is VREF-$\Delta$v.

16. The method of claim 15, wherein the AND gate is configured to receive the OUT- signal.

17. The method of claim 16, wherein the adjusted VREF is a first adjusted VREF, wherein the PRE-AMP is a first PRE-AMP, wherein the AND gate is a first AND gate, and wherein the TRI signal is a first TRI signal, the method further comprising:

comparing the VIN and a second adjusted VREF that is VREF+$\Delta$v by a second PRE-AMP;

outputting a second TRI signal by the second PRE-AMP, wherein the second TRI signal is based on a comparison between the VIN and VREF+$\Delta$v; and receiving the second TRI signal and the OUT+ signal by a second AND gate.

18. The method of claim 17, further comprising:

comparing the first TRI signal and the second TRI signal by an OR gate; and outputting the CLKsf signal by the end gate.

19. The method of claim 18, wherein the CLKsf is configured to cycle when the VIN is inside a range from VREF-$\Delta$v to VREF+$\Delta$v, and wherein the CLKsf is configured not to cycle when the VIN is outside the range from VREF-$\Delta$v to VREF+$\Delta$v.

20. The method of claim 19, wherein the latch is configured to change its state when the VIN is inside a range from VREF-$\Delta$v to VREF+$\Delta$v, and wherein the latch is configured not to change its state when the VIN is outside the range from VREF-$\Delta$v to VREF+$\Delta$v.

* * * * *